United States Patent [19]
Yang et al.

[11] Patent Number: 6,133,525
[45] Date of Patent: Oct. 17, 2000

[54] MINIATURE LOW COST MODULAR ASSEMBLY PACKAGE AND METHOD OF ASSEMBLY

[75] Inventors: Shi-Lang Yang, Brooklyn, N.Y.; Dhiren Bhatt, Jersey City, N.J.; Wei-Ping Zheng, Brooklyn, N.Y.

[73] Assignee: Scientific Component, Inc., Brooklyn, N.Y.

[21] Appl. No.: 09/088,312

[22] Filed: Jun. 1, 1998

Related U.S. Application Data

[60] Provisional application No. 60/049,005, Jun. 9, 1997.

[51] Int. Cl.$^7$ .................................................. H01L 23/02
[52] U.S. Cl. ........................ 174/52.4; 257/684; 257/692; 257/693
[58] Field of Search .......................... 174/52.4; 257/676, 257/684, 692, 693, 696, 730, 713, 721; 361/718

[56] References Cited

U.S. PATENT DOCUMENTS

| | | |
|---|---|---|
| 3,961,415 | 6/1976 | Davis, Jr. .................................. 29/591 |
| 4,513,355 | 4/1985 | Schroeder et al. ...................... 361/403 |
| 4,972,253 | 11/1990 | Palino et al. .............................. 357/74 |
| 5,285,352 | 2/1994 | Pastore et al. .......................... 361/707 |
| 5,468,994 | 11/1995 | Pendse .................................... 257/693 |
| 5,656,985 | 8/1997 | Lu et al. .................................. 336/96 |
| 6,002,168 | 12/1999 | Bellaar et al. .......................... 257/696 |

*Primary Examiner*—Kristine Kincaid
*Assistant Examiner*—W. David Walkenhorst
*Attorney, Agent, or Firm*—Kevin Redmond

[57] ABSTRACT

A modular miniature circuit built entirely within the case of the module without a primary printed circuit board conventionally used as a bottom support for the circuit component. The circuit components are mounted on the inside of the case and the leads of the components are attached directly to the module's terminals, greatly reducing lead inductance. The elimination of the primary PC board results in a substantial reduction in cost and physical size and the reduction in lead lengths results in a significant enhancement of high frequency performance. The "flip chip" construction provides a flat surface for pick up by automatic assembly equipment without the added cost of a cover.

7 Claims, 4 Drawing Sheets

PRIOR ART

MINIATURE LOW COST MODULAR ASSEMBLY PACKAGE AND METHOD OF ASSEMBLY

This application claims benefit of provisional application Ser. No. 60/049,005 filed Jun. 9, 1997.

BACKGROUND

1. Field

The present invention relates generally to the construction of miniature modular electronic circuits and more particularly to miniature modular RF components, such as mixers, couplers, transformers, power splitters and the like.

2. Prior Art

For many years, surface mount electronic modular circuits have been constructed using a PC board to support the circuitry within the module. A case is placed over the PC board to protect the circuitry on the board of the case. The case also provides a flat surface for pick up by automatic assembly equipment.

FIG. 1 shows a bottom view of a prior art modular circuit with a case 1, a primary PC board 2, and terminals 3 connected electrically to the board. The terminals provide a means of external connections for this module.

FIG. 2 shows a front sectional view of the prior art modular circuit shown in FIG. 1. The sectional view permits viewing inside the module where internal components, such as a core 4, can be seen mounted on the PC board.

This type of prior art construction has eight principal disadvantages:

1. Assembled PC boards carrying components must be placed into the case and attached to the cover. The construction is costly because a PC board is required and the board with the components loaded on to it must be placed into the case and soldered to the terminals.

2. Once the board is assembled inside the case, it forms a semi-sealed area about the components which can allow water or other liquids used for cleaning the assemblies to become trapped in this area and to remain for long periods before they evaporate. Prior to evaporation these liquids can adversely affect the electrical performance of the module.

3. Leads from components which are to be connected to a terminal must follow a long lead path includes first being connected to a PC board land and then following a PC board trace to the terminal. This circuitous path add lead inductance which further detracts from the RF performance.

4. The presence of the PC board adds height to the module which is often unacceptable in modern miniaturized equipment, such as hand held cellular units.

5. The board first must be tested before it is placed within the case and then retested after it has been installed in the case. This requires running the same tests twice for the same component before it is acceptable for shipment.

6. Reduced reliability results from the added solder connections on the leads from the components to PC board traces and then on the leads from the traces to the terminals.

7. The prior art assembly system which using a primary printed circuit board results in less flexibility in the wiring because every component is typically tied to the primary printed circuit board. Wiring in a three dimensional manner is not possible. For example, a diode quad may have terminals on the top of its package which could be advantageously connected directly to another components or a terminal above the diode quad, if three dimensional connections were possible; however, with conventional circuitry using a printed circuit board, the diode quad leads must be first brought down and connected to the printed circuit board.

8. Conformal coating, which is required to withstand high voltage, is difficult to apply or inspect.

As electronic equipment becomes more complex, there is continuing industry pressure to improve the reliability while at the same time reducing the number of components and overall size of electronic module. There is also pressure to reduce the cost of assembly, components and testing. All of these industry objectives are met with the present invention.

SUMMARY

It is an object of the present invention to provide a miniature electronic module which does not required a primary circuit board.

It is an object of the present invention to provide a miniature electronic module with a reduced profile height.

It is an object of the present invention to provide a miniature electronic module with reduced RF lead lengths and enhanced RF performance.

It is an object of the present invention to improve the reliability of the connections from the components within the module to external circuitry.

It is an object of the present invention to improve the circuit layout.

It is an object of the present invention to provide a miniature surface mount electronic module at reduced cost, which is suitable for installation by automatic assembly equipment.

It is the object of the present invention to provide a miniature electronics module which facilitates the application of conformal coating or other coatings to components to provide high voltage or other protection.

It is the object of the present invention to provide a miniature electronics module which permits rapid draining of unwanted fluids.

The invention comprises a miniature electronic module in which the circuitry of the module is fabricated within the module case without the use of a primary circuit board. The circuitry is mounted on the inside of the case by means of an adhesive such as chip bonder and the leads of the components are brought directly to the case terminals, without passing through the traces of a printed circuit board. The result is shortened lead lengths and enhanced RF performance. The elimination of the primary PC board permits the reduction of the profile height of the module, while also reduces component cost. The bottom of the case is left open permitting any unwanted fluids to drain quickly.

DETAILED DESCRIPTION OF THE INVENTION

Figure 3:
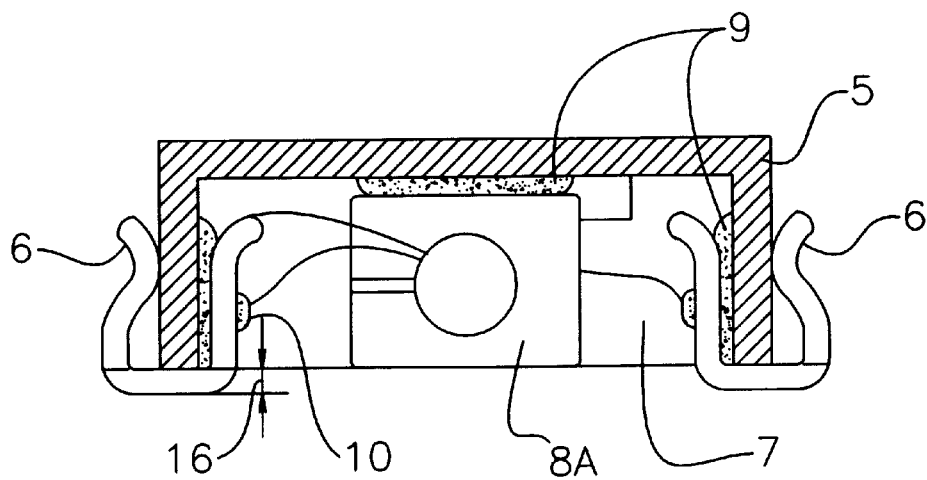
FIG. 3 is a front sectional view of a module constructed in accordance with the present invention showing internal components and their connection to the module's terminals.
Figure 4:
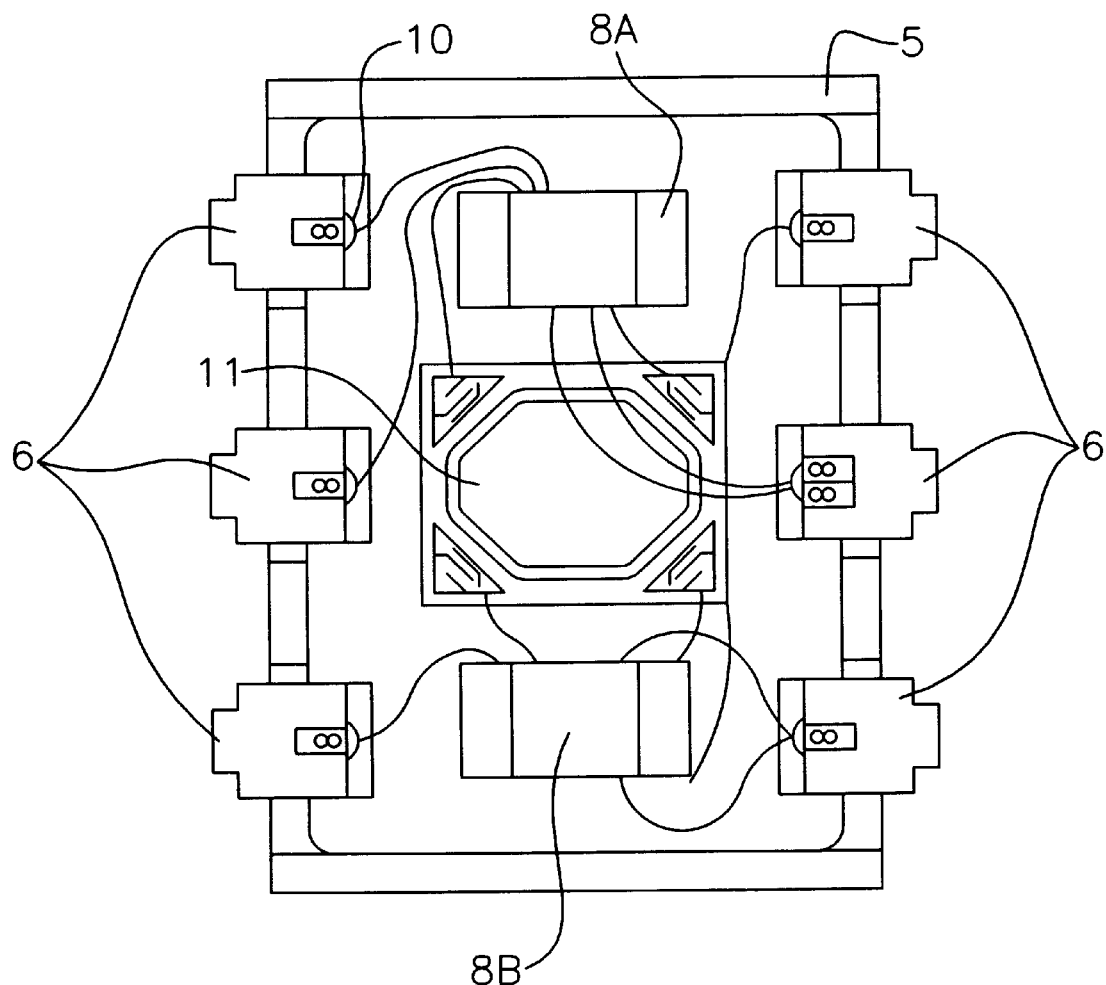
FIG. 4 is a bottom view of the module shown in FIG. 3.

A preferred embodiment of the present invention is shown in FIGS. 3 and 4. These Figures show a front sectional view and a bottom view respectively of the invention as it is used to house a doubly balanced mixer circuit. These Figures show the invention to include a case 5, a terminal 6, an open bottom to the case 7, a first core 8A, a second core 8B, chip bonder 9, a diode quad chip 11 and a welded connection 10 between a wire lead from core 8A and a terminal 6.

As can be seen in FIG. 4, the module contains six identical terminal leads, all referred to simply as terminal and all called out by a single drawing numeral 6. These terminals are used to make connections between the circuitry within the module and external circuitry.

Figure 1:
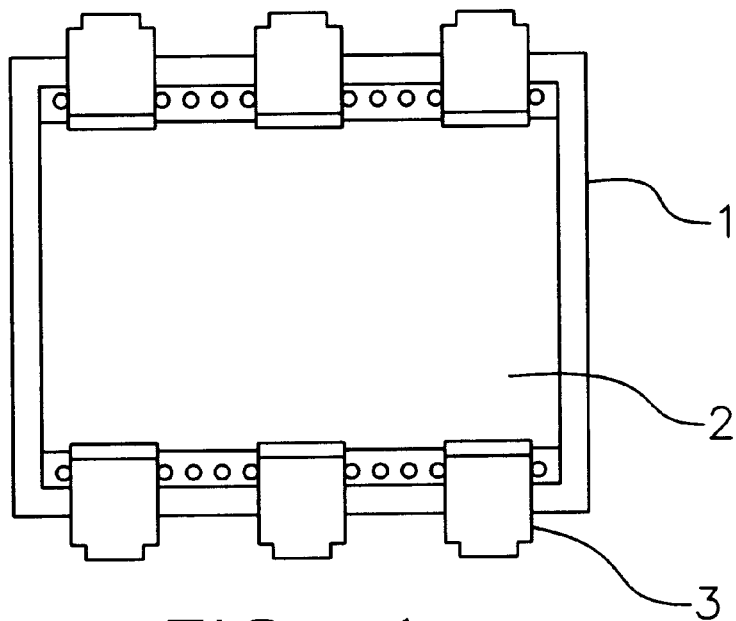
FIG. 1 is a bottom view of a prior art module.
Figure 2:
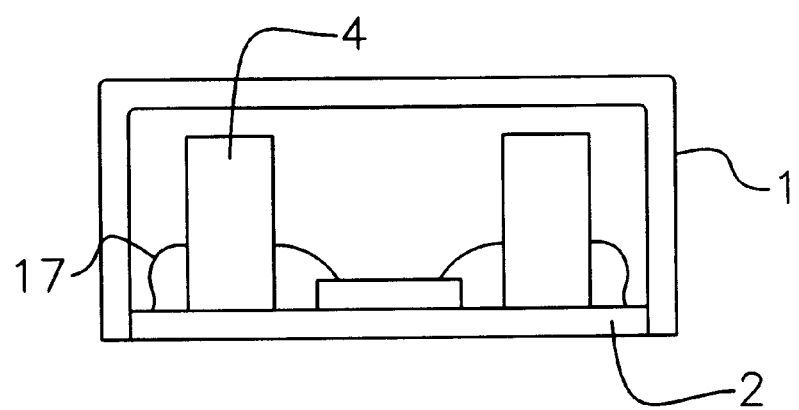
FIG. 2 is a front sectional view of a prior module showing the internal components and the PC board.

As can be seen in FIG. 3, the side walls and the top of the case 5 serve to replace the PC board used in prior art modules. FIG. 2 shows a prior art module to include a case 1, a primary PC board 2, and a core 4, which is mounted to the PC board. In the present invention, as shown in FIG. 3, the core 8A is mounted on the top inside of the case 5 rather than on the PC board and it is secured to the case by means of chip bonder. All component parts including the terminals 6 are also secured to the case in a similar manner. The terminals 6 are "U" shaped and are slid over the case wall before chip bonder is applied.

The component leads are preferably welded to the terminals as was done at connection 10 in FIG. 3 to enable these lead to remain attached to the terminals while soldering the terminals to external circuitry is carried out. However, the use of high temperature solder and/or wrapping of the component lead about the terminals may be used as alternative processes for securing the component leads to the terminals.

In the present invention, the use of the case in place of a printed circuit board has several immediately identifiable advantages. The elimination of the PC board, reduces the cost and the size of the module. A miniature prior art surface mounted mixer module is typically 0.2 inches high and the PC board within this mixer is typically 0.03 inches thick. The use of the present invention reduces the profile height of the 0.2 inch high mixer to 0.105 inches, a 47.5% improvement. Where the mixer is the highest profile component on the board, the reduction in height translates to a volume reduction of 0.095 inch multiplied by the board area of say 6 square inches. This amounts to as much as one-half cubic inch in volume which is a significant savings in compact miniature equipment, such as hand held cellular telephone units. With this construction module heights as low as 0.08 inches have been realized.

The case used in the present invention typically has a plurality of flat sides; however, only one flat side is required, such as the top side shown in FIG. 3, for the module to be picked up and assembled by a vacuum head typically employed in automatic assembly equipment.

Unlike most electronic miniature modules, the case in the present invention is left open at the bottom, as indicated by drawing numeral 7 in FIG. 3. This open bottom does not adversely affects the module's performance or the security of the components within the module. It does, in fact, have the opposite effect. That is, the open bottom construction improves RF performance, lowers cost and still provides protection for the internal components.

During the construction of a surface mount mixer module, the module may be washed with water or other cleaning solvents and the cleaning operation may be carried out a number of times. Typically, prior art modules are closed, but they are not typically solvent proof. The modules therefore often have water droplets residing on RF components. The result is usually detuning of the circuit, which can be sufficient to cause a unit with this problem to fail its electrical specifications. Such a problem with a prior art unit may require baking the unit to speed drying and then retesting to be sure the units performance is finally acceptable. The baking and retesting all add to the cost of the unit and the need for such steps bring into question the repeatability and reliability of the prior art production process.

A more serious problem occurs when moisture is absorbed and the module is in a circuit in the field. It cannot be baked and it is not just a module that has failed. It is an entire system. These moisture problems are eliminated in the present invention where the open bottom permits rapid drying and fast recovery without the need for baking the module.

In addition, prior art miniature modules which use a PC board and have the bottom areas closed have an inherently higher testing and rework cost than the modules fabricated in accordance with the present invention. Normally, the internal circuitry of a prior art miniature module must be tested prior to its installation in the case because, if there is a failure, it is difficult to rework this type of module once the PC board has been installed in the module. The prior art module must again be tested after installation in the case to be sure there was no damage or incorrect connections made during installation.

This additional step of retesting essentially doubles the testing cost over what is required for the present invention. If a completed prior art module fails final test, it is either discarded for a total loss or it must first have the cover removed and the circuit must then be reworked and retested. The cover has to be replaced and finally the unit must be tested again as a completed module, all of which constitutes a very costly repair process.

With the present invention, only one test is required because the unit is already in its case when it is tested. The single test is the final test. Rework, when necessary, is relatively easy to carry out because all the components and connections can be viewed and are accessible through the open bottom of the case. The components need not be removed before they can be worked on.

Although, the components in the present invention are accessible from the bottom of the case, these components are well protected by the case, once the module has been installed on an external PC board. During installation of the present invention on an external PC board, the module is first held with its bottom side adjacent to the external PC board and then its terminals are soldered in place. The result is the components are protected on four sides and on the top by the case and on the bottom by the external PC board.

Even though the module is soldered down by its terminals to an external PC board, it can still "breathe". That is, it is still vented and can dry out internally quite rapidly because the bottom is still open and the bottom is held off from the external PC board by the thickness of the terminals, as can be seen by the spacing 16 above the external board shown in FIG. 3.

The lead lengths from components in the present invention are reduced over those used in the prior art for two principal reasons. The first of these reasons can be seen by observing lead 17 in prior art FIG. 2 which goes from core 4 to PC board 2. It is difficult in a practical application to dress and solder a lead, like lead 17, tightly from the core to the PC board because there would be no strain relief and because lead attachment would require a difficult manual operation. It takes one hand or an instrument in one hand to hold the lead wire and a second hand to make attachment.

A tightly dress lead would leave the wire sharply bent at the core and taut between the core and the board. This condition of the lead could result in a failure due to either thermal expansion or vibration. Therefore, the leads from components to the PC board typically have some slack or strain relief built into them, as is the case with lead 17. The present invention takes advantage of this slack requirement in the leads by dressing the leads to the terminals rather than the PC board lands. When this is done, the leads are equal to what they were in the prior art modules or only slightly longer, but the much longer overall path length in prior art modules which required passing through the PC board traces, is completely eliminated.

In the present invention, the lead from the component can go on a direct path to the terminals. The use of the PC board in prior art modules requires the wire to first go down to the board and then across to the terminal. Herein, directly connected or a direct connection means connected through a wire or other conductor without passing through the lands of a printed circuit board.

The lead path in the present invention can be loosely viewed as the hypothenuse of a right triangle, while the lead path in the prior art can be viewed as the much longer sum of the two side adjacent the right angle. Finally, there is always some distributed capacitance to ground added with a PC board which is essentially absent when the wires are kept away from the ground plane, as they are in the present invention.

In the present invention, the application of conformal or another coating is made simple. As can be seen in FIG. 3, the coating can be poured through the open bottom in case 5. The coating is also easy to inspect. During this operation, the case opening is facing upwards and the components and the coating can be seen. In the prior art, the application of a coating is carried out through a hole in a closed case and cannot be inspected.

The improvement in performance can be seen by a comparison of a prior art mixer and a similar mixer produced in accordance with the present invention. The prior art mixer has a specified upper frequency of 3000 MHz.

A mixer incorporating the present invention increased the upper frequency to 3500 MHz with specification comparable to the prior art mixer, but these specifications are maintained over a 20% greater frequency range and isolation or balance is improved significantly by as much as 5 to 10 dB.

Figure 5:
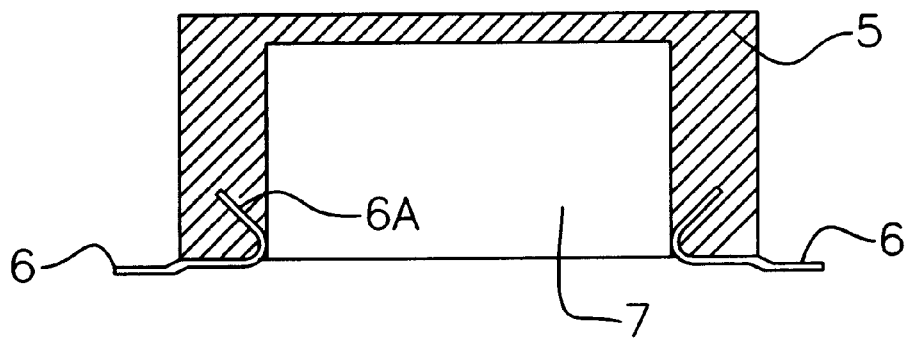
FIG. 5 is a side sectional view of one embodiment of a case used in the present invention in which the module's terminals are embedded on the inside of the case wall adjacent the bottom of the case.
Figure 6:
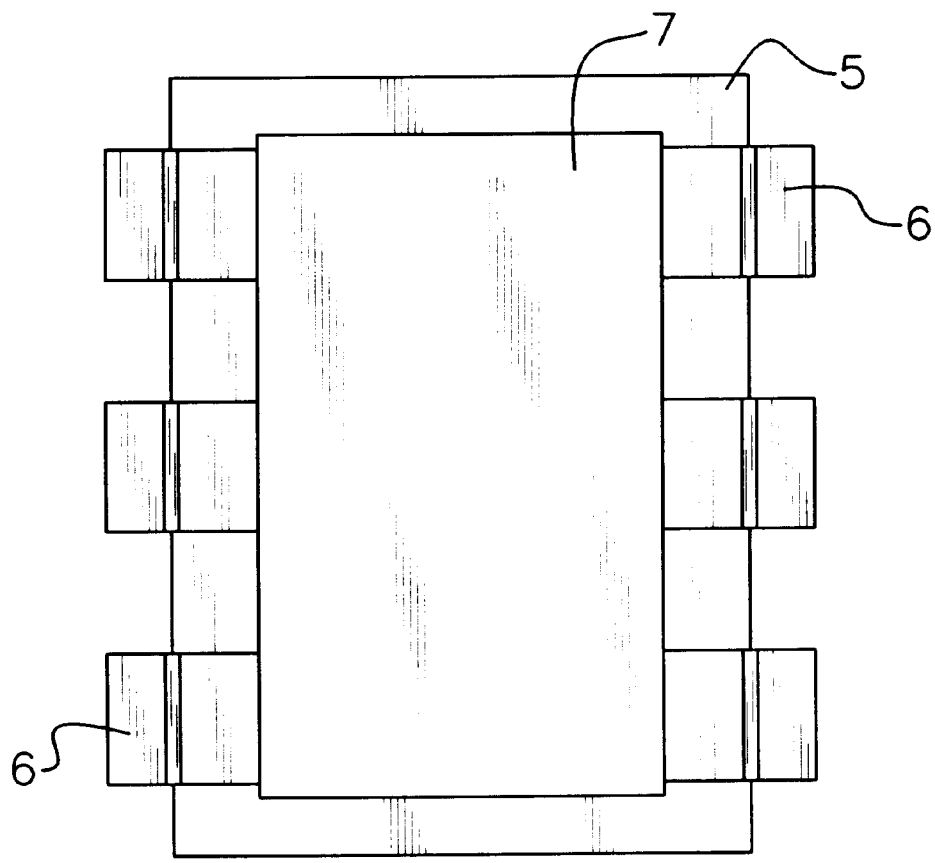
FIG. 6 is a bottom view of the case shown in FIG. 5 showing the location of the module's terminals.

In the present invention, there are several methods of securing the terminals to the case. As shown in FIG. 3, the terminal 6 can be secured by means of chip bonder 9 to the inside walls of case 5. FIGS. 5 and 6 show a second method of securing where an extension 6A of the terminal 6 is embedded in the case wall immediately adjacent to the opening 7.

Figure 8:
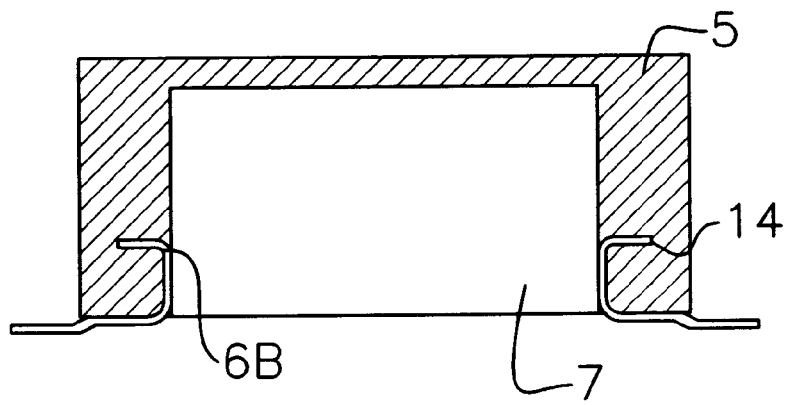
FIG. 8 is a side sectional view of another embodiment of the case used in the present invention in which the module's terminals are embedded in the case on the inside along a side wall at a specified distance away from the bottom of the case.

FIG. 8 shows a third method of securing the terminal 6 by means of a longer extension 6B of the terminal which extends up inside the case and is spaced away from the opening. The end the numeral 14 of the terminal extension 6B is embedded in the case wall at its upper end.

Figure 7:
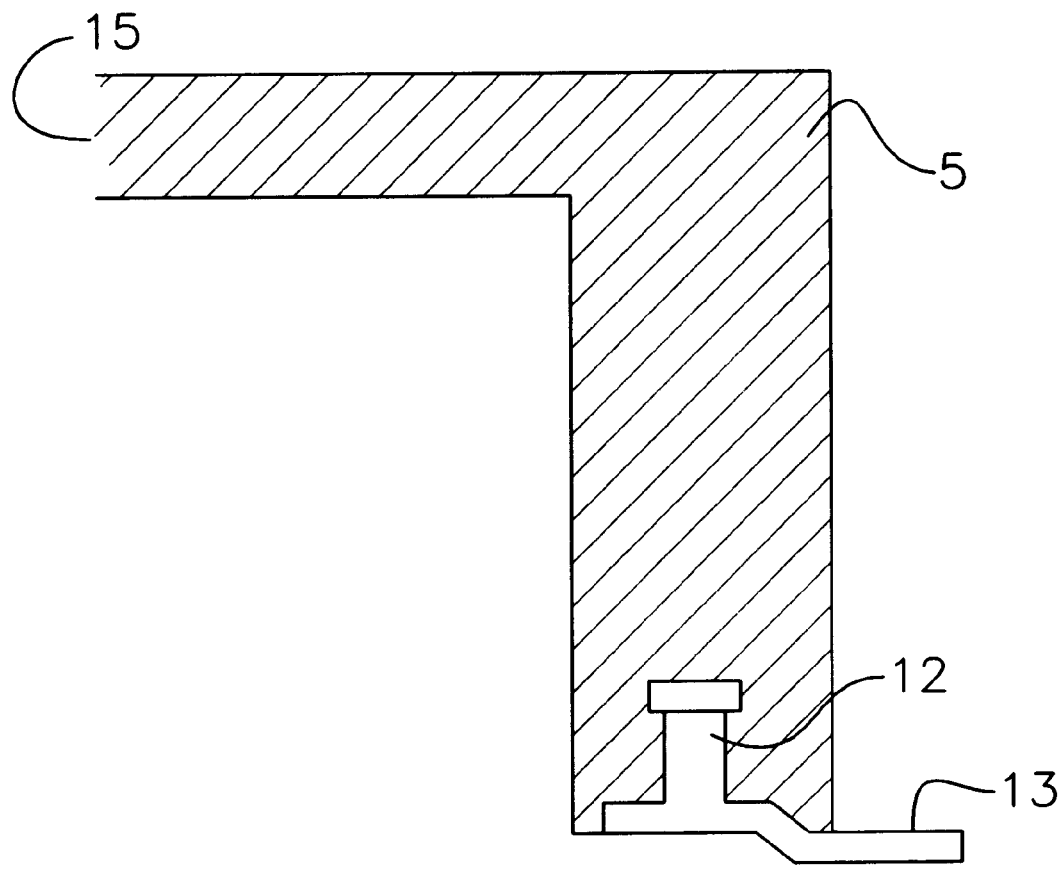
FIG. 7 is a side sectional view of the case of the present invention showing the use of a pin to hold a module's terminal. This pin is embedded in the side wall of the case and emerges from the bottom of the case wall.

FIG. 7 shows a fourth method of securing a terminal to the case. In this method, a pin 12 is embedded in a case side wall and extends out of the bottom of the wall where it is attached to hold a terminal in place. In this Figure, the case is designated by drawing numeral 5, the portion of the terminal connected to pin 12 which extends outside of the case is designated by drawing numeral 13 and the top of the case is designated by drawing numeral 15.

The structures shown in all Figures have side wall which when they meet are orthogonal. This is generally the type of structure use for electronic modules and the use of this type of structure facilitates the description of the module. Orthogonal means at right angles. However, when used herein, it is used in a practical sense and means what may be referred to as "generally orthogonal" which is to acknowledge that almost no practical structure is precisely made at a perfect 90° angle without any tolerance and that a tolerance of a few degrees, say ±3.0 for example, from 90°, will have little or no effect on the practical description or function of a structure.

Having described our invention, we claim:

1. A miniature electronic circuit module comprising:
   (a) a case having a cavity, said cavity having a plurality of cavity sides with at least a first one of said cavity sides being referred to as the first cavity side and said first side being exposed to the outside of said case to provide access to said cavity, said first cavity side also being referred to as the cavity opening,
   (b) a terminal secured to said case and having at least a portion of said terminal exposed to the outside of said case, and
   (c) at least a first electronic component located within said cavity in said case, said first component being directly connected to said first terminal, said first cavity side also being referred to as the bottom of said case, said case including a second case side positioned generally away from said cavity opening and oriented orthogonal to said bottom of said case, and said first terminal being positioned to extend along the bottom of said case between said cavity opening and said second case side, said first terminal includes a terminal extension which extends up into said cavity opening and is embedded in said second wall from the inside of said case to secure said terminal to said case.

2. A module as claimed in claim 1 wherein said cavity opening occurs in a second case side, referred to as the bottom of said case and said case includes a thrid case side positioned generally orthongonal to said bottom of said case, and said first terminal being positioned to extend along the bottom of said case between said cavity opening and said thrid case side.

3. A module as claimed in claim 1 wherein said terminal extension is embedded in said second wall adjacent said cavity opening.

4. A module as claimed in claim 1 wherein said extension is embedded in said second wall at a distance away from said cavity opening.

5. A method for providing a miniature electronic circuit module comprising the steps of:
   (a) providing a case having a cavity, said cavity having a plurality of cavity sides with at least a first one of said cavity sides being referred to as the first cavity side and said first cavity side being exposed to the outside of said cavity to provide access to said cavity, said first cavity side also being referred to as the cavity opening, and said case including a second cavity side adjacent and orthogonal to said first cavity side, (b) providing at least one terminal secured to said case and having at least a portion of said terminal exposed to the outside of said case, (c) providing at least a first electronic component located within said cavity, said first component being directly connected to said first terminal, (d) directly connecting said first component to said first terminal, (e) supplying an extension to said first terminal which extends up into said cavity opening, and (f) embedding the end of extension of said first terminal in said second cavity inside said case to secure said terminal to said case.

6. A method for providing a module as claimed in claim 5, further comprising the step of embedding said extension of said terminal in said second cavity side adjacent said cavity opening.

7. A method for providing a module as claimed in claim 5, further comprising the step of embedding said extension of said terminal in said second cavity side at a distance away from said cavity opening.

* * * * *